(12) United States Patent
Guterman et al.

(10) Patent No.: US 6,751,766 B2
(45) Date of Patent: Jun. 15, 2004

(54) INCREASING THE EFFECTIVENESS OF ERROR CORRECTION CODES AND OPERATING MULTI-LEVEL MEMORY SYSTEMS BY USING INFORMATION ABOUT THE QUALITY OF THE STORED DATA

(75) Inventors: Daniel C. Guterman, Fremont, CA (US); Stephen Jeffrey Gross, Cupertino, CA (US); Geoffrey S. Gongwer, Los Altos, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/152,137

(22) Filed: May 20, 2002

(65) Prior Publication Data

US 2003/0217323 A1 Nov. 20, 2003

(51) Int. Cl.[7] ................................................ G11C 29/00
(52) U.S. Cl. ....................................................... 714/736
(58) Field of Search ............................... 714/763, 718, 714/721, 722, 719

(56) References Cited

U.S. PATENT DOCUMENTS

| | | | |
|---|---|---|---|
| 4,872,171 A | * 10/1989 | Wakumura et al. | 714/771 |
| 5,517,510 A | * 5/1996 | Kuban et al. | 714/783 |
| 5,657,332 A | 8/1997 | Auclair et al. | |
| 5,841,816 A | * 11/1998 | Dent et al. | 375/331 |
| 6,049,899 A | 4/2000 | Auclair et al. | 714/721 |
| 6,222,762 B1 | 4/2001 | Guterman et al. | 365/185.03 |
| 6,275,419 B1 | 8/2001 | Guterman et al. | 365/185.29 |
| 6,317,363 B1 | 11/2001 | Guterman et al. | 365/185.23 |
| 6,317,364 B1 | 11/2001 | Guterman et al. | 365/185.28 |
| 6,526,009 B1 | * 2/2003 | Van Gestel | 369/47.14 |

OTHER PUBLICATIONS

"Notification of Transmittal of the International Search Report or the Declaration", corresponding PCT application No. PCT/US03/14975, International Searching Authority, United States Patent Office, Jul. 8, 2003. 5 pages.

* cited by examiner

*Primary Examiner*—Albert Decady
*Assistant Examiner*—Cynthia Britt
(74) *Attorney, Agent, or Firm*—Parsons Hsue & de Runtz LLP (57) ABSTRACT

The quality of data stored in a memory system is assessed by different methods, and the memory system is operated according to the assessed quality. The data quality can be assessed during read operations. Subsequent use of an Error Correction Code can utilize the quality indications to detect and reconstruct the data with improved effectiveness. Alternatively, a statistics of data quality can be constructed and digital data values can be associated in a modified manner to prevent data corruption. In both cases the corrective actions can be implemented specifically on the poor quality data, according to suitably chosen schedules, and with improved effectiveness because of the knowledge provided by the quality indications. These methods can be especially useful in high-density memory systems constructed of multi-level storage memory cells.

38 Claims, 6 Drawing Sheets

INCREASING THE EFFECTIVENESS OF ERROR CORRECTION CODES AND OPERATING MULTI-LEVEL MEMORY SYSTEMS BY USING INFORMATION ABOUT THE QUALITY OF THE STORED DATA

BACKGROUND

1. Field of Invention

The invention relates to methods for managing data, more specifically to increasing the capabilities of error correction codes and to operating memory systems by utilizing indication about the quality of the data.

2. Discussion of Related Art

The continued increases in data storage densities are achieved, among others, by decreasing the sizes of individual memory cells, decreasing the inter-cell separation, and using several signal levels to store more data per cell. Decreasing sizes make the cells more susceptible to external perturbations, decreasing the inter-cell separation can introduce unwanted interference between cells, and multi-level data storage makes it more likely that deviations from the preferred ranges result in misreading of the data. All these negative side effects of increasing storage densities make it more likely that the data will be corrupted.

Traditional ways to reconstruct corrupted data include the application of Error Correction Codes (ECCs). Simple Error Correction Codes store additional parity bits, which capture the parity of the sum of a word's bits, when the data is written into the memory system. If during storage the data is corrupted, the parity of the sum of bits may change. Upon reading the data from the memory system, the parity of the sum of the word's bits is computed once again by the ECC. Because of the data corruption the computed parity may not match the content of the parity bits, and the ECC may detect the corruption.

There are more sophisticated error correction codes in use today. But the basic concept remains: ECCs compute some summary information of the data upon writing the data into the memory system. This summary information is then stored in additional bits. During the readout the summary information is computed once again by the ECC, and the result is compared with the result, stored in the additional bits. If the two do not agree, the data has been corrupted during storage or the operation of the memory system.

ECCs can have at least two functions: error detection and error correction. The latter function is typically harder. An early example is the (7,4) Hamming code, which has the capability of detecting 2 errors per word, but it can correct the words only if they contain a single error.

More sophisticated ECCs today can correct more than a single error per word. But beyond 2 or 3 random errors per word even for sophisticated ECCs it becomes computationally increasingly complex to reconstruct the data. Common practice is to recover the data with some acceptably small probability of incorrect recovery. However with increasing number of errors the probability of reliable data recovery also decreases rapidly, or the associated costs in additional hardware and/or performance become prohibitively high.

Therefore auxiliary methods which increase the capability of the Error Correction Codes in today's memory systems are desired.

Some auxiliary methods have been described in detail in U.S. Pat. Nos. 5,657,332 and 6,049,899, both granted to D. Auclair et al., which are hereby incorporated by reference in their entirety. These patents developed the concept of soft error handling.

In semiconductor memory devices, including EEPROM systems, data can be represented by the voltages of particular gates. Typically, different digital data storage values are represented by well-separated voltage levels. If, for some reason, during the read operation the voltage levels shift from their preferred ranges by an amount comparable to the level separation, errors may be detected by the ECC.

Many errors develop gradually. Memory cell voltages can drift away from the preferred ranges for a number of reasons. These include external perturbations, for example, variations in the operating conditions, as well as internal influences, such as interference during writing into neighboring memory cells. The above inventions describe methods for regular monitoring of the data of the memory cell array even before the voltage shifts result in an actual ECC-detected error. After the monitoring operations found voltages having started shifting from the preferred voltage ranges, different corrective actions can be executed. A possible corrective action is "scrubbing" the array. Scrubbing can include rewriting the complete sector of the erroneous memory cell into a different sector of the array.

Recently the density of data storage has been further increased by implementing multi-level storage schemes, in which single memory cells store not only binary "0"s and "1"s, but several more levels. The number of the levels is often chosen to be 4, 8, or 16. Such multi-level memory systems have been described in U.S. Pat. No. 6,222,762 B1, granted to D. Guterman et al, and U.S. Pat. No. 6,275,419 B1, granted to D. Guterman et al., which are hereby incorporated by reference in their entirety. In such multi-level systems 4, 8, or 16 voltage levels can be distinguished within the same overall voltage range. Correspondingly the separation of voltage levels decreases and increasingly smaller voltage shifts can lead to errors.

Therefore auxiliary methods which increase the capability of the Error Correction Codes to detect and reconstruct corrupted data in high-density arrays of multi-level memory cells are desired.

SUMMARY OF INVENTION

Briefly and generally, the quality of data, stored in a memory system, is assessed by different procedures, and the memory system is operated according to the assessed quality. The data quality can be assessed during read operations. Subsequent application of an Error Correction Code (ECC) can utilize the quality indications to detect and correct the data with improved effectiveness. Alternatively, a statistics of data quality can be constructed and the digital representation of the data modified to diminish data corruption. In both cases the corrective actions can be implemented specifically on the poor quality data, and, aided by the quality indications, with improved effectiveness. These methods can be especially useful in high-density memory systems, constructed of multi-level cells.

According to one aspect of the invention, data quality assessment can take place during reading the data storage values from the memory cells of an array, such as an array of EEPROM cells. The reading can take place with precision higher than required by the end user of the data. For example, data storage values intended to store data in four bits, can be read with seven-bit precision. The higher precision readout of the data storage values can then be converted to lower precision digital data values, required by the user, plus an associated indication of the quality of the data. If the Error Correction Code detects a corrupted digital data value, it will be able to reconstruct the corrupted digital data value data more effectively utilizing the associated quality indications.

For example, if the ECC finds a corrupted digital data value and the associated quality indications indicate that the corresponding data storage value is above a preferred range, then most likely the data storage value drifted down from the adjacent preferred range of the one higher digital data value. Embodiments of the invention relay this quality indication to the ECC, which can then correct the corrupted digital data value, directing it to the one higher digital data value in this example.

According to another aspect of the invention, statistics of the data quality assessments can be formed even without the ECC indicating an error. A distribution of how many data storage levels drifted by what amount within the sectors can be constructed. In sectors, where the distribution shows systematic shifts, the assignment of digital data values to data storage values can be shifted by a corresponding amount to compensate for the systematic shift. In sectors, where the distributions got broader, corrective actions can be scheduled or performed in response, according to the severity of the broadening. These corrective actions may include rewriting the erroneous data or the entire corresponding sector, with high or low priority.

According to another aspect of the invention, the errors detected by the ECC can be counted within the sectors. Depending on the number of errors per sector, different types of corrective actions can be implemented, with high or low priority.

DETAILED DESCRIPTION

When data is read from a memory system, such as an array of memory cells, it may contain errors for a variety of reasons. These errors can be corrected by applying, for example, Error Correction Codes (ECCs). The efficiency of an Error Correction Code can be enhanced by generating indications about the quality of the data, and applying the Error Correction Code in combination with the indications about the data quality. Also, the memory system can be operated based on the quality indication even without the ECC indicating the presence of errors. The invention can be practiced in any kind of memory or storage system, such as, for example, random access memories, non-volatile or flash memories, magnetic or optical discs. The memory systems can represent data with two or multi-level schemes. As an example, first an array of memory cells will be described, and then different methods for improving the efficiency of the Error Correction Codes will be discussed.

Figure 1:
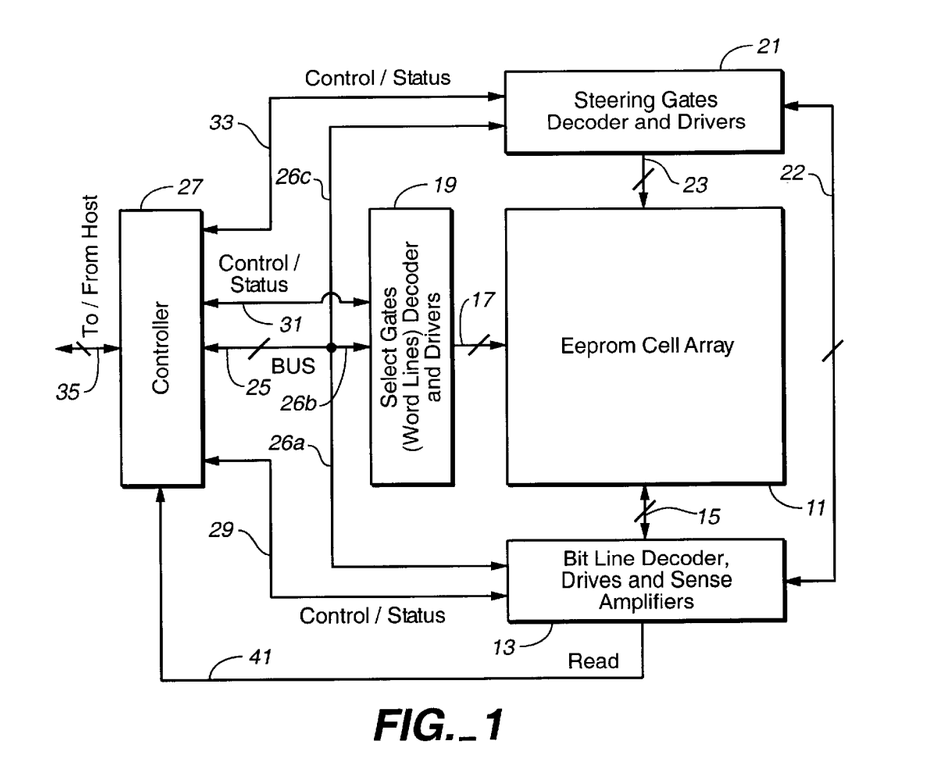
FIG. 1 illustrates a memory system, including an array of memory cells.

FIG. 1 shows a block diagram of a memory system including an array of memory elements. A large number of individually addressable memory cells are arranged in a regular array 11 of rows and columns. Individual memory cells can be controlled by bit lines, select gates arranged in word lines, and steering gates. Bit lines are designated herein to extend along columns of array 11, and word lines are designated to extend along the rows of array 11. Bit line unit 13 may include a bit line decoder, storage elements, driver circuits and sense amplifiers. Bit line unit 13 can be coupled to cell array II by line 15, and to controller 27 by bit-control line 29 and by read line 41. Word line unit 19 may include a select gate decoder and driver circuits. Word line unit 19 can be coupled to cell array 11 by line 17, and to controller 27 by word-control line 31. Steering line unit 21 may include a steering gate decoder and driver circuits. Steering unit 21 can be coupled to cell array 11 by line 23, to controller 27 by steering-control line 33, and to bit line unit 13 by line 22. Bit line unit 13, word line unit 19 and steering unit 21 can be coupled to bus 25, which in turn is coupled to controller 27. Controller 27 can be coupled to the host by line 35.

When a preselected memory cell is to be programmed, voltages can be applied to the bit lines, word line and steering gates, corresponding to the preselected memory cell, at predetermined levels sufficient for the programming of the preselected cell. Controller 27 sends the address of the preselected memory cell through bus 25 to the respective decoders in bit line unit 13, word line unit 19, and steering gate unit 21 through lines 26a, 26b, and 26c, respectively. Status and control commands between bit line unit 13, word line unit 19, steering gate unit 21 and controller 27 are communicated through bit-control line 29, word-control line 31 and steering control line 33.

When a preselected memory cell is to be read, voltages can be applied to the corresponding bit lines, word line and steering gates, corresponding to the preselected memory cell, at predetermined levels, sufficient to enable the reading of the preselected memory cell. Controller 27 is capable of applying the voltages of the bit lines through bit-control line 29, applying the voltages of the word lines through word-control line 31 and applying the voltages of steering gates through steering control line 33. A current can be generated through the preselected memory cell by these voltages. The current is indicative of whether the preselected memory cell was programmed or not. The value of the current can be amplified and compared against references by sense amplifiers in bit line unit 13, the result of which can be temporarily stored in latches or registers. The resultant data, read out from the preselected memory cell, can be sent to controller 27 through read line 41.

Figure 2A:
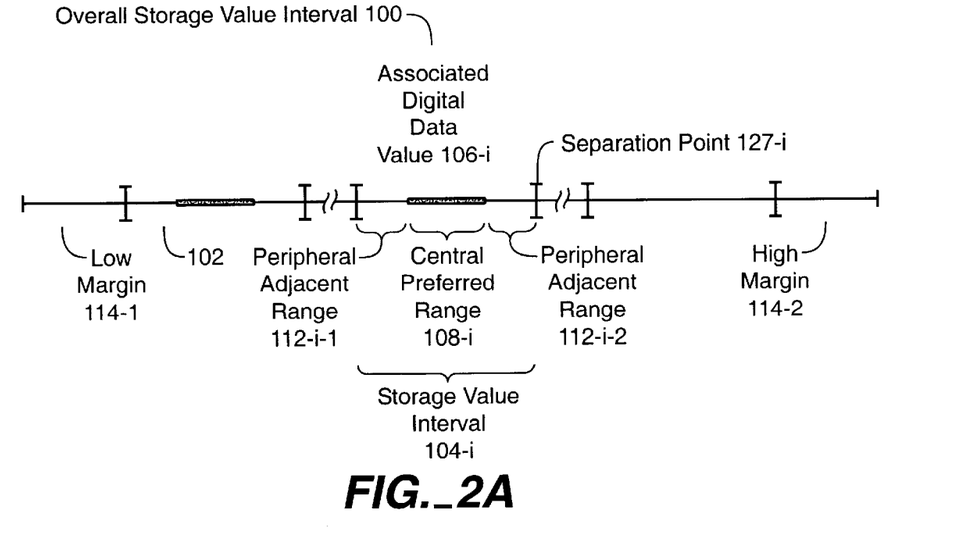
FIGS. 2A and 2B illustrate different embodiments for representing the data storage values.
Figure 2B:
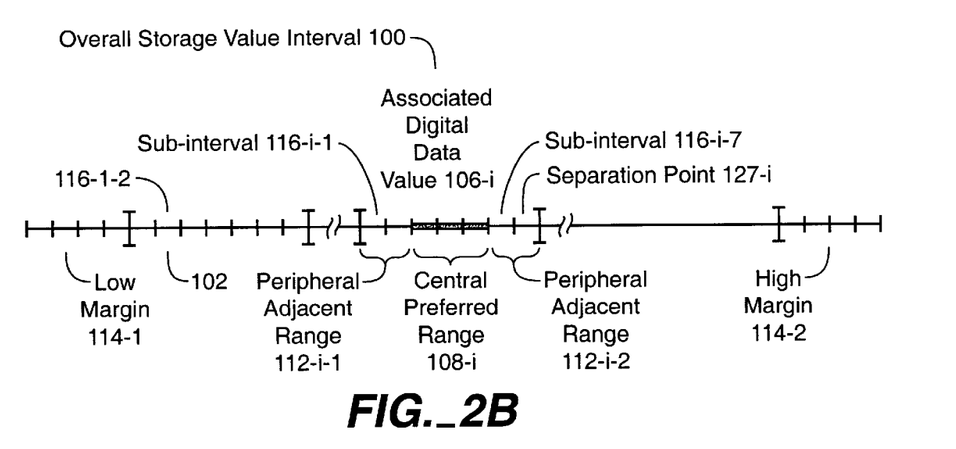
Figure 2C:
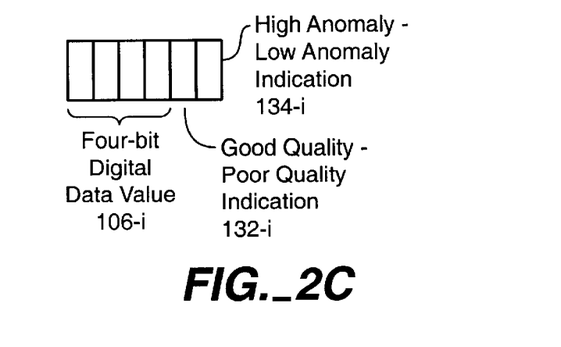
FIG. 2C illustrates an embodiment for associating quality indications with the digital data values.

FIGS. 2A–C illustrate an embodiment of the invention. During the operation of the memory system, data storage values 102 can be read from an array of memory cells. The data storage values 102 can be read as values of a signal. Possible signals include, for example, voltage or current levels. In some embodiments the data storage values 102 are transferred to controller 27, where an Error Correction Code can be applied to the data storage values. In order to increase the data storage density, some memory systems apply multi level storage schemes, where individual memory cells can store data not only associated with binary "0"s and "1"s, but in several states. The number of these states can be chosen to be a power of 2, including 4, 8, or 16. The values of the signal corresponding to data storage values 102 can lie within an overall signal storage value interval 100. In some embodiments overall signal storage value interval 100 can be divided into individual storage value intervals 104-*i* to capture the multi-level aspect of data storage values 102 in terms of digital data values. Here i denotes positive integers. The read data storage value 102 then falls into one of the storage value intervals 104-*i*. The storage value intervals 104-*i* can correspond to the levels of the multi-level data storage values. Accordingly, i can take the corresponding values between 1 and 4, 8, or 16. Storage value intervals 104-*i* can be adjacent, and substantially equal in magnitude. In order to convert from analog data storage values to digital data values, digital data values 106-*i* can be associated with storage value intervals 104-*i*. As an example, if a multi-level memory system stores 4 bits of data in $2^4$=16 levels, then the overall signal storage value interval 100 can be correspondingly divided into 16 storage value intervals 104-*i*, and the 16 digital data values 106-*i* can be correspondingly associated with the 16 storage value intervals 104-*i* in order to capture the 16 possible data storage values. Accordingly, i can take on values between 1 and 16. A possible assignment of the digital data values 106-1 through 106-16 can be the integers from 0 through 15, or 1 through 16.

Within storage value intervals 104-*i*, central preferred ranges 108-*i* and peripheral adjacent ranges 112-*i* can be defined. A central preferred range 08-*i* can be a range of signal values contained within a storage value interval 104-*i*, for example, spanning the middle portion of storage value interval 104-*i*. The peripheral adjacent ranges 112-*i* can be ranges of signal values within storage value intervals 104-*i*, on one or both sides of the central preferred range 108-*i*. As mentioned before, voltage levels may shift from their designed values. To accommodate such shifts, a low margin 114-1 and a high margin 114-2 is allocated at the ends of the overall storage value interval 100.

As illustrated in FIG. 2A, in some embodiments central preferred ranges 108-*i* and peripheral adjacent ranges 112-*i* can be defined in terms of analog signal values. In this specific example, the read data storage value 102 lies in the peripheral adjacent range 112-1-1 of storage value interval 104-1, thus it has the associated digital data value 106-1, which is "1."

As illustrated in FIG. 2B, in other embodiments storage value intervals 104-*i* can be further divided into sub-intervals 116-*i–j*, where j is a positive integer. For example, an individual storage value interval 104-*i* can be divided into 7 sub-intervals 116-*i–j*, where correspondingly j can take on values between 1 and 7. In this case, in a multi level memory system with, for example, $2^4$=16 levels, the overall signal storage value interval 100 can be divided into 128 sub-intervals. Out of this 128 sub-interval 16×7=112 sub-intervals are used to accommodate the 16 storage value intervals 104-*i* with 7 sub-interval in each storage value interval 104-*i*, and 8 and 8 sub-intervals are used to accommodate the low and high margins 114-1 and 114-2, respectively. The sub-intervals can be substantially equal in magnitude. In this specific example, the read data storage value 102 lies in sub-interval 116-1-2, therefore it lies within peripheral adjacent range 112-1-1 and thus has the associated digital data value 106-1, which is "1."

In some embodiments the data storage value 102 can be first converted into digital data with a high precision according to the sub-intervals, and then central preferred ranges 108-*i* and peripheral adjacent ranges 112-*i* can be defined in terms of these high-precision digital data. In the specific example above, the data storage value 102 can be converted into a seven-bit digital data according to which sub-interval 116-*i–j* it lies in, wherein j can assume values from 1 to 7. The seven-bit digital data value range 116-*i*-1 through 116-*i*-7 can be represented by the four-bit digital data value 106-*i* as an "i." For example, the seven-bit digital data value range 116-1-1 through 116-1-7 can be associated with the four-bit digital data value 106-1 as a "1," the seven-bit digital data value range 116-2-1 through 116-2-7 can be associated with the four-bit digital data value 106-2 as a "2," and so on. The central preferred range 108-1 can be the seven-bit digital data value range 116-1-3 through 116-1-5, and the peripheral adjacent ranges 112-1-1 and 112-1-2 can be the seven-bit digital data ranges 116-1-1 through 116-1-2 and 116-1-7 through 116-1-8, respectively. Storage value intervals 104-1 and 104-2 can be separated by separation point 127-1.

If the sub-intervals 116-*i–j* are indexed with an overall number from 1 to 128, then the above assignments can be restated as follows. The low margin 114-1 is associated with sub-intervals 1–8, the digital data value "1" is associated with sub-intervals 9–15, the digital data value "2" is associated with sub-intervals 16–22, and so on. Within sub-intervals 9–15 the central preferred range is sub-intervals 11–13, and the peripheral adjacent ranges are 9–10 and 14–15, and so on.

When a data storage value 102 is read from the memory system, an individual storage value interval 104-*i* is identified within which the read data storage value 102 lies. Also identified is whether data storage value 102 lies within the central preferred range 108-*i*, or in a peripheral adjacent range 112-*i*-1 or 112-*i*-2 within the storage value interval 104-*i*.

The digital data value 106-*i*, which is associated with the data storage value's storage value interval 104-*i*, can be chosen as the digital representation of the data storage value 102. This digital representation of the data storage value 102 will be supplemented with indication concerning the quality of the data storage value 102. This quality indication can reflect where the data storage value 102 falls within storage value interval 104-*i*. If the data storage value 102 falls within the central preferred range 108-*i*, a "Good Quality" indication can be generated. If the data storage value 102 falls outside the central preferred range 108-*i*, and within a peripheral adjacent range 112-*i*-1 or 112-*i*-2, a "Poor Quality" indication can be generated. In some embodiments this indication can be associated with the digital data value 106-*i*, representing data storage value 102. For example, a binary digit can be attached to the digital data value 106-*i*, where a binary "1" can represent "Good Quality", and a binary "0" can represent "Poor Quality". In some embodiments the opposite convention can be utilized.

If a data storage value 102 has a "Poor Quality" indication, then a further indication can be generated about its quality by identifying the peripheral adjacent range 112-*i–j* within which the data storage value 102 lies. If data storage value 102 lies in peripheral adjacent range 112-*i*-1 with a value lower than the lowest value of the corresponding preferred central range 108-*i*, then a "Low Anomaly" indication can be generated. If data storage value 102 lies in peripheral adjacent range 112-*i*-2 with a value higher than the highest value of the corresponding preferred central range 108-*i*, then a "High Anomaly" indication can be generated. In some embodiments this indication can be associated with the digital data value 106-*i*, representing data storage value 102. For example, an additional binary digit can be attached to the digital data value 106-*i*, where a binary "1" can represent "High Anomaly", and a binary "0" can represent "Low Anomaly". In some embodiments the opposite convention can be utilized.

FIG. 2C illustrates a corresponding embodiment of the invention, where a data storage value 102 has specifically 16 levels, thus the associated digital data value 106-$i$ has four bits. Quality indication 132-$i$ is associated with this digital data value by attaching a fifth bit, representing "Good Quality" or "Poor Quality", and an Anomaly indication 134-$i$ is associated as a sixth bit, representing "High Anomaly" or "Low Anomaly."

The digital data 106-$i$ can be read into controller 27 for processing with using an error correction code, while the associated quality indication can be stored temporarily, for example, in a buffer. The quality indication can be read in later, if the error correction code requires further indication.

The quality indication can be associated with the digital data values already within the memory. In the above embodiment, the data storage values are read with seven-bit precision. Then the four-bit digital data value 106-$i$ and the quality indications 132-$i$ and 134-$i$ are associated with the data storage value 102 within the memory and subsequently shifted out to the controller.

In other embodiments the seven-bit representation of the data storage values can be shifted out to the controller, and the controller extracts the representative four-bit digital data value and the associated quality indications. In further embodiments a "look-up" table is generated, with $2^7=128$ entries, within the above example. The entries' addresses in the look-up table correspond to the 128 sub-intervals, within which the data storage values can lie. The entries at the addresses can contain six bits, four representing the digital data values and the remaining two the quality indications. The quality indications can indicate, for example, "Good Quality" or "Poor Quality," and "High Anomaly" or "Low Anomaly." Such look-up tables can be hosted, for example, in Random Access Memories. When the data storage value is read, the sub-interval is determined within which the data storage value lies. Next, the look-up table's six-bit entry, corresponding to the determined sub-interval, is shifted out to the controller for further processing.

For a variety of reasons digital data values 106-$i$ can be corrupted. Some of the reasons can be the leakage of the charges from memory cells, a problem exacerbated by the ever-diminishing size of memory cells in high-density memory systems. These high densities are also achieved by decreasing the inter-cell separation. This aspect of modern memory array design leads to an enhanced chance for interference between memory cells in close proximity. For example, charges of one memory cell can create an electric field, a fraction of which impinges on and modifies the read-out current of another memory cell. Finally, data can also be corrupted depending on the history experienced by the cell. Data storage values in memory cells, which are written and read excessively, may be more likely to develop errors by shifting from the preferred central ranges.

Because of the possibility of corruption, the digital data values should not be transferred to a user without some form of testing and correcting. In many memory systems these functions are carried out by applying an error correction code (ECC) to digital data values 106-$i$. Typically, an ECC is applied to the data when writing the data into the memory and the result stored, for example, in additional bits alongside the data. An example is the (7,4) Hamming code, which associates three additional bits with every four-bit word to achieve a minimum Hamming distance of three between any two of the 16 possible four-bit data. The ECC is recomputed when reading the same data and its associated ECC bits, and the results of the recomputation of the ECC can be compared with the mathematically expected result. If the recomputed and the expected results are the same, then the data were probably not corrupted, whereas, if the recomputed and expected results do not agree, then the data have been corrupted.

It is noteworthy that the ECC can be applied to data groups of different sizes. Furthermore, in flash memory systems the ECC can be computed for its associated data sector, while the data is read essentially simultaneously.

Once the number of items of data that are corrupted exceeds a threshold defined by the particular ECC in use, the probability of properly reconstructing the data drops off precipitously. For example, if in a sector of 512 bytes of data one or two items of data are corrupted, the appropriate ECC can reconstruct the corrupted data with 100% certainty. However, if the number of corrupted data is higher than a critical number, for example, between three and ten, for some ECCs about five, then the ECC has a prohibitively low probability of reconstructing the data correctly, and potentially a prohibitively high probability of reconstructing the data incorrectly.

Many ECCs use additional bits for data recovery. A general relation concerning the ECC's ability to reconstruct data was first given by Hamming. If a memory system uses binary words of length m, capable of coding $n=2^m$ different data, then t corrupted data can be corrected reliably, if the memory system uses at least P additional bits, where a lower bound on the value of P is given by the "lower Hamming limit":

$$P \geq \sum_{i=0}^{t} \binom{n}{i}$$

Equivalently, this relation can be read to state that if a memory system uses P additional bits then an ECC is capable of reconstructing words reliably with at most t corrupted bits. In many systems P is chosen such that the reconstruction of a data sector with one or two errors can be carried out with high reliability.

To address this issue, ECCs not only generate the most likely reconstruction of the data, but they can also evaluate the reliability of the reconstructed data. In the above example, if the ECC detects the presence of about one or two corrupted data, then the ECC can indicate that the reconstructed data are very likely correct. In this case the reconstructed data can be transferred from controller 27 to a user. If the ECC finds about three to five corrupted data, then the ECC can indicate that the probability of having reconstructed the corrupted data correctly is reduced. Depending on the subsequent usage of the data, controller 27 can then decide whether to accept or reject the reconstructed data and transfer it to a user. Finally, if the ECC finds more than about five corrupted data, then the ECC can indicate that the probability of having reconstructed the corrupted data correctly is very low or that it is unable to reconstruct the data. The actual numerical values may differ from the quoted ones in different implementations of ECCs.

There is also the chance of false data reconstruction. Since the ECC is using only summary indication about a data sector, it may also find by coincidence that replacing the corrupted "8" with a "3" seemingly lowers the error count, and therefore accepts the "3." Such false data reconstruction can rapidly aggravate the data recovery, making it unreliable.

In these and other cases of reduced reliability, the controller 27 may employ auxiliary corrective methods to increase the reliability of the ECC. Some embodiments of the invention increase the reliability of the ECC by providing additional indication about the data. This can be achieved, for example, by controller 27 reading in the stored quality indications associated with digital data values 106-$i$.

One cause for the limitations of the ECC's ability to reconstruct the data is that the ECC is unable to determine the locations of the corrupted bits within the data sector, and thus is unable to correct the corrupted data. This problem can be remedied by some embodiments of the invention, since "Poor Quality" data are likely candidates for being corrupted data, and since when the quality of an item of data is determined, its location is also known. Therefore the location of "Poor Quality" data can also be provided to the ECC. Consequently, the ECC's ability to reconstruct the data reliably within the time frame available for error correction can be increased by suggesting to the error correcting process bits likely to be in error, based on their identified "Poor Quality."

Figure 3:
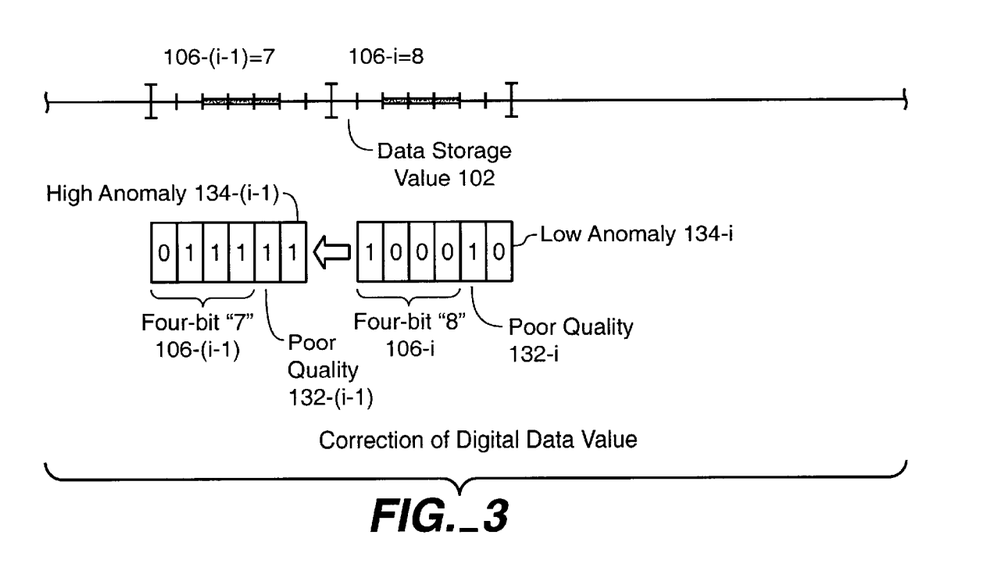
FIG. 3 illustrates an example for recovering data using quality indications.

FIG. 3 illustrates another advantage of some embodiments: they can provide suggestions for the ECC about how to reconstruct a corrupted item of data. If, for example, computing the ECC indicates the presence of corrupted data in a data sector, then the four-bit digital data value 106-$i$ that has the Quality Indicator 132-$i$ indicating a "Poor Quality," is a likely candidate for being the corrupted data. If, in particular, the four-bit digital data value 106-$i$ has a "Low Anomaly" indication, then it is likely that before the corruption the corresponding storage data value 102 was represented by a digital data value lower by one, 106-($i$−1). For example, if the digital data value of a "Poor Quality" data storage value was an "8" with a "Low Anomaly" indication, then it is likely that before the corruption the storage data value corresponded to the digital data value "7," and shifted upward from there. The embodiment can then suggest the ECC to try correcting the corrupted "8" specifically to a "7." This suggestion can increase the reliability of the reconstructed data and thus the effectiveness of the ECC, since in the absence of such indication the ECC has to try all possible numbers in its effort to correct the corrupt "8," lowering its chances to reconstruct the corrupted data correctly within the typically short time frames available for data correction.

It is possible that upon reading a sector more than one digital data value will be characterized as "Poor Quality." If the number of "Poor Quality" digital data values is n, then there are $2^n-1$ possible ways of correcting the corrupted data according to the quality indications, since each of the n digital data values can be individually changed. With a high probability the reconstructed data can be found among these $2^n-1$ possible corrections. Thus by suggesting to the ECC to start the data reconstruction by trying these $2^n-1$ combinations first, the digital data values can potentially be reconstructed faster. It is worth noting that no additional time consuming read operations are needed, all the indication for the data reconstruction already being available to the ECC and controller.

The quality indications can be utilized in yet another way. When a sector of data is read from a memory system, the quality indications can also be collected to generate and track the statistical distribution of the data storage values of the sector and its quality. An advantage of doing so is that data corruption may be systematic within some sectors. Reasons for this may have their origin in external circumstances, such as a change of temperature, modifying the operating parameters of the sector. Or the reason can be connected to the history of the sector. For example, since erase operations, based on Fowler-Nordheim tunneling, can bias the source-substrate junction of certain flash memory cells close to the breakdown voltage, frequent erase operations may cause the deterioration of the physical structure of the memory cell, potentially leading to charge loss. Also, it is possible that during the manufacturing process the characteristics of a particular sector deviate from the preferred values because of manufacturing or material irregularities. Such systematic data corruption can be acted upon using the statistics of quality indications.

Figure 4A:
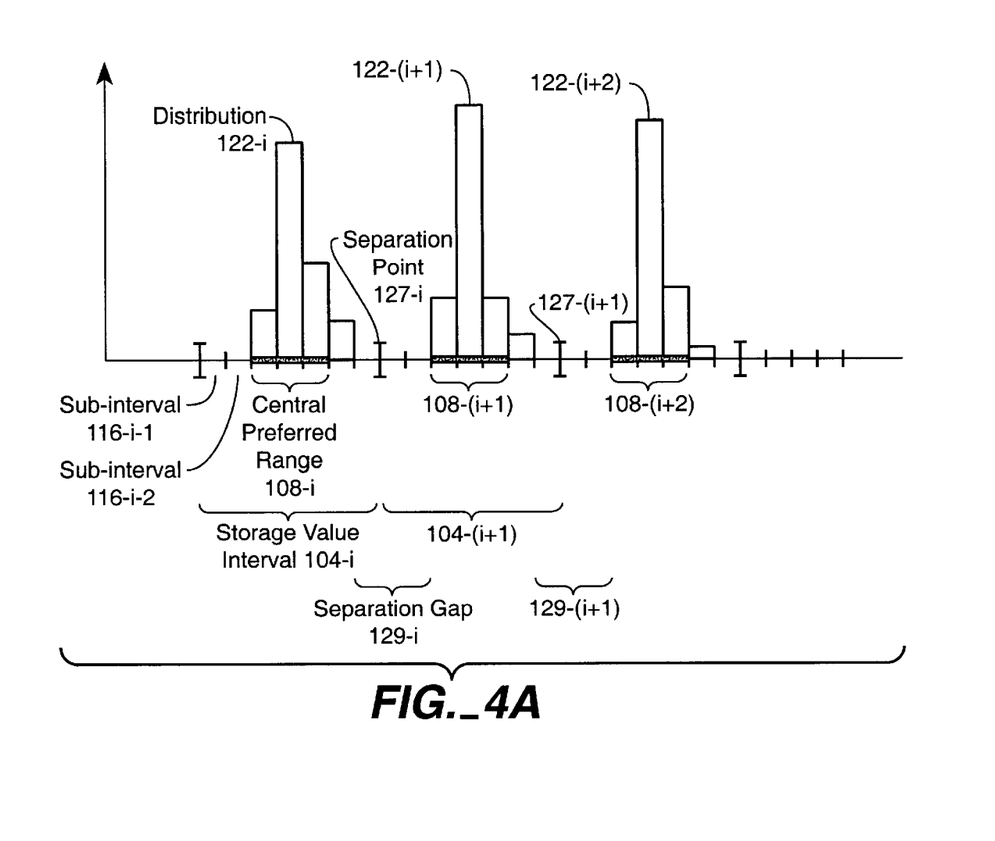
FIGS. 4A–C illustrate different distributions of the data storage values within a data sector.
Figure 4B:
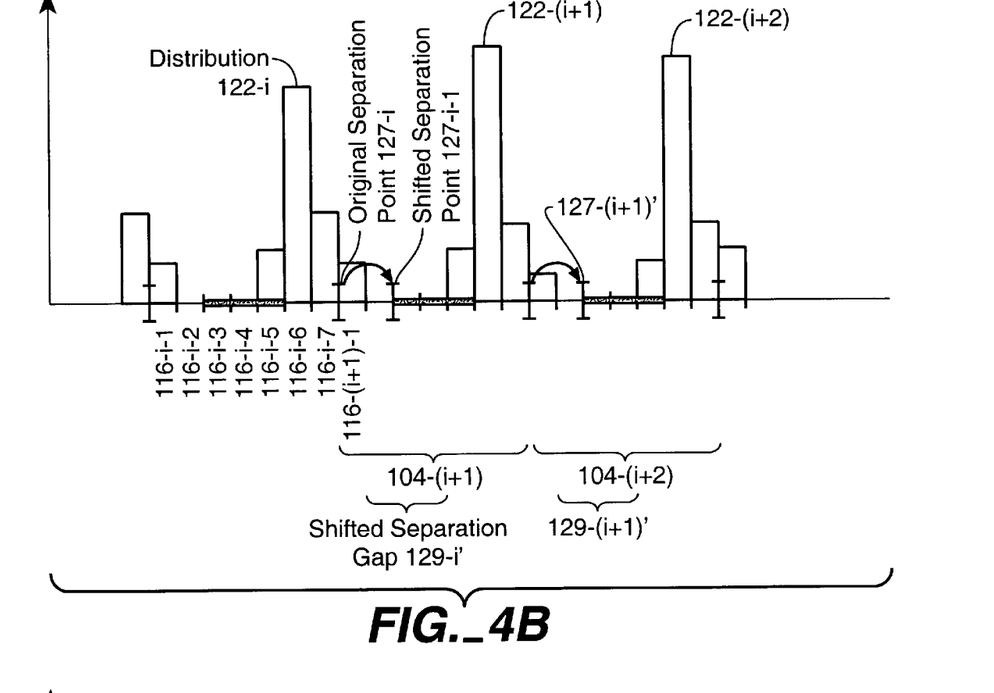
Figure 4C:
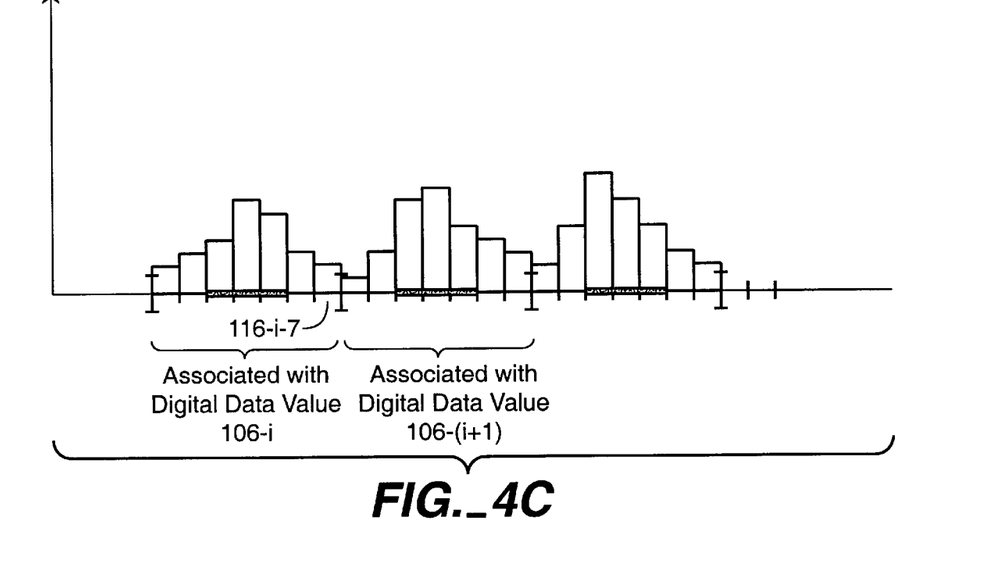

FIGS. 4A–C illustrate possible statistical distributions of data storage values in two neighboring storage value intervals 104-$i$ and 104-($i$+1). As shown in FIG. 4A, in typical cases data storage values will exhibit distributions of the type 122-$i$ and 122-($i$+1) around the corresponding preferred central ranges 108-$i$ and 108-($i$+1). In this case distributions 122-$i$ and 122-($i$+1) are well separated in the sense that most or all data storage values lie close to the corresponding preferred central ranges 108-$i$ and 108-($i$+1) and very few or none are in the vicinity of separation point 127-$i$. This fact can be re-expressed by introducing the concept of a separation gap 129-$i$ between distributions 122-$i$ and 122-($i$+1). The separation gap 129-$i$ denotes a range where very few or no data storage values lie, and it is located around separation point 127-$i$. Data storage values which lie between separation points 127-$i$ and 127-($i$+1) will be associated with digital data value 106-$i$, and so on.

FIG. 4A shows an embodiment, in which storage value intervals 104-$i$ and 104-($i$+1) are divided into sub-intervals 116-$i$-j and 116-($i$+1)-j, respectively, where j can take on values between 1 and 7. In this embodiment distributions are well separated, if most or all of data storage values lie within sub-intervals with j values between 2 and 6, the majority of which lie in the central preferred ranges with j between 3 and 5. In case of such well-separated distributions, data storage values 102 can be related to digital data values 106-$i$ with high reliability.

FIG. 4B shows a possible situation, when neighboring distributions 122-$i$ and 122-($i$+1) are corrupted in a systematic manner. Such systematic corruption can be caused by, for example, a variation of temperature. In this case distributions 122-$i$ and 122-($i$+1) are shifted upwards in the sense that the number of "High Anomaly" data is larger than the number of "Low Anomaly" data. In cases of such a systematic shift, distributions 122-$i$, 122-($i$+1), and 122-($i$+2) still remain well separated.

FIG. 4B again illustrates an embodiment in which storage value intervals 104-$i$ are further divided into sub-intervals 116-$i$–j. The systematic shift is seen by the distributions 122-$i$, 122-($i$+1), and 122-($i$+2) having some data storage values within Sub-intervals j=1, essentially no data storage values in j=2, 3, and 4, and the bulk of the data storage values in the sub-intervals j=5, 6, and 7. In this case, before getting shifted, the data storage values in sub interval 116-($i$+1)-1 most likely corresponded to the storage value interval 104-$i$ and thus were associated with digital data value 106-$i$, and not with 106-($i$+1), which would be associated with them in an unmodified procedure.

If the statistics of the data storage values of a sector is found to exhibit a systematic shift, and the distributions remain well separated by a shifted separation gap 129-$i$', in some embodiments the controller 27 may employ some corrective action after a sufficient statistics has been collected about the data sector. For each pair of neighboring distributions 122-$i$ and 122-($i$+1) the controller 27 may identify the corresponding systematic shift of these distributions, and then shift the separation point 127-$i$ by the identified systematic shift to 127-$i'$. In the example of FIG. 4B, distributions 122-$i$ and 122-$(i+1)$, and in particular their separation gap 129-$i$, have been shifted up by two sub-intervals. Consequently the controller 27 may counteract this systematic shift by shifting separation point 127-$i$ up by two sub-intervals to 127-$i'$. This means that in subsequent read operations, data storage values lying in interval 116-$(i+1)$-1, visibly belonging to distribution 122-$i$, will be assigned the correct digital data value of 106-$i$, and not 106-$(i+1)$.

These shifts need not be uniform across overall storage value interval 100, in that the above-mentioned external or internal causes of systematic shifts might affect the different storage value intervals 104-$i$ within overall storage value interval 100 differently.

FIG. 4C illustrates another possibility, where the neighboring distributions 122-$i$ and 122-$(i+1)$ do not exhibit a systematic shift, but rather a broadening. Such a broadening can lead to the overlapping of the tails of the distributions, as shown in FIG. 4C. When a data storage value lies in the overlap region, and computing the ECC with the assigned digital data value indicates an error, the assignment of digital data values can be individually modified. Similarly to the embodiment of FIG. 3, if the data storage value lies in the overlap region, for example, in sub-interval 116-$i$-7, then the digital data value 106-$i$ will be associated with it, as well as a "Poor Quality" indication and a "High Anomaly" indication. Consequently, if the ECC detects the presence of errors within the data sector, then, based on the quality indications, some embodiments will suggest to the ECC to correct the assignment of this data storage value from digital data value 106-$i$ to digital data value 106-$(i+1)$.

According to another aspect of the invention additional corrective actions can be executed based on the statistics of a sector's "Poor Quality" data. These corrective actions can be executed by a controller external to the memory system, or, in other embodiments, by some logic internal to the memory system. Hereafter, the unit, which executes the corrective action, will be referred to as "the controller." The total number of "Poor Quality" data can be counted in any data sector of a memory system. This counting can be executed, for example, during some or all readings of the data of the sector, or during specific "house keeping" operations, aimed only at determining the quality of the data of the sector. In this embodiment it is not even necessary that the application of an FCC indicate the presence of errors in the data sector. Even if the ECC indicates that the data sector is error free, an increase in number of "Poor Quality" data can indicate that the quality of data in the sector is degrading. Driven by this indication proactive corrective actions can be performed in a timely manner, thus preventing the appearance of actual errors.

Figure 5:
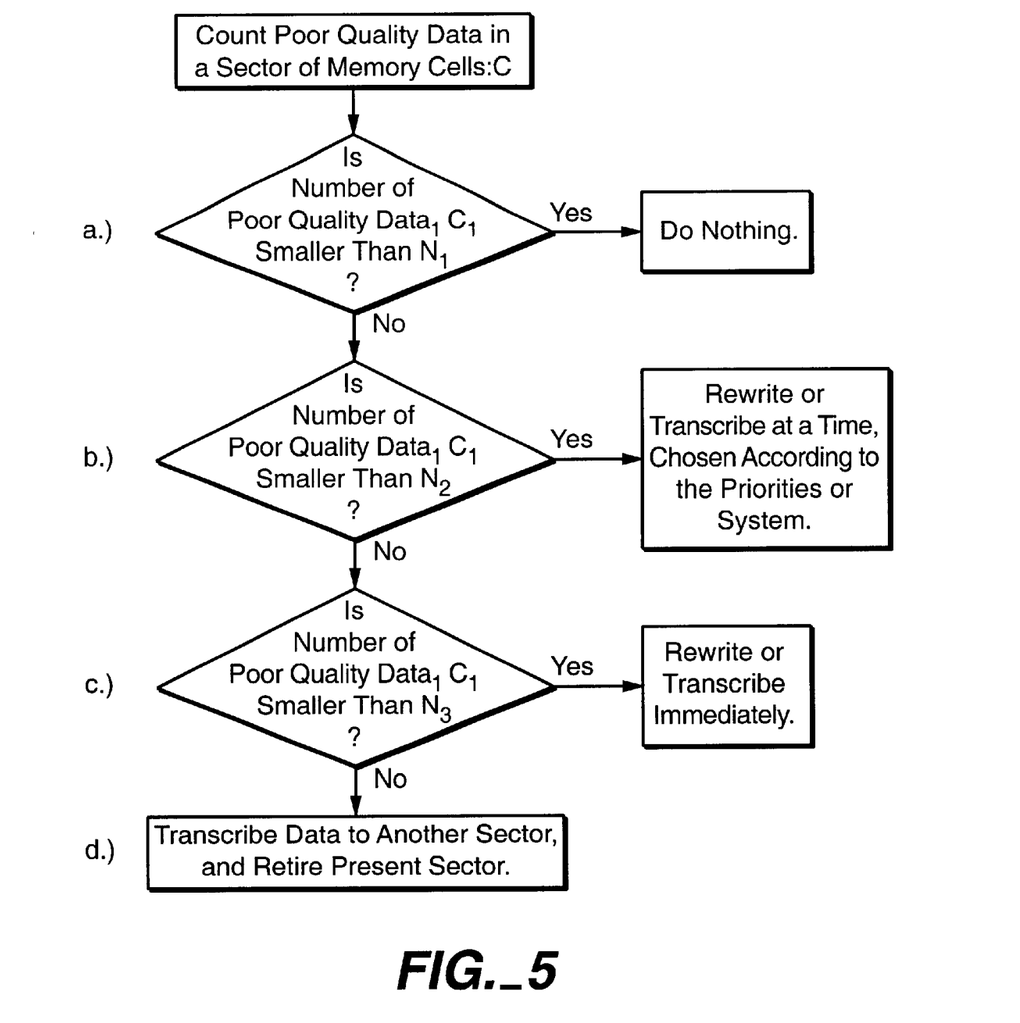
FIG. 5 illustrates a flowchart of operating the memory system based on the statistics of the quality indications of the data sector.

FIG. 5 illustrates a flow chart of operating a memory system in relation to the count of "Poor Quality" data.

a) If C, the count of "Poor Quality" data of a sector is zero, or smaller than a first predetermined value $N_1$, $C<N_1$, this indicates that the quality of the sector's data did not degrade, or only to a low, tolerable degree. Therefore, no corrective actions are required.

b) If C, the count of "Poor Quality" data of a sector is between a first and a second predetermined value, $N_1 \leq C < N_2$, this indicates that the quality of the sector's data degraded to some degree. Therefore, the data of the sector should be refreshed, rewritten, or transcribed to another sector at some time. However, the degree of degrading is such that the probability of actual errors developing is low. Therefore, the above corrective actions need not be executed immediately, but can be delayed until a suitable later time. For example, these corrective actions can be executed at a time, when the memory system has finished executing the read commands, and is also not performing any other higher priority jobs.

c) If C, the count of "Poor Quality" data of a sector is between a second and a third predetermined value, $N_2 \leq C < N_3$, this indicates that the quality of the sector's data degraded to a considerable degree, which requires that the data of the sector be refreshed, rewritten, or transcribed immediately, or within a short, predetermined delay.

d) If C, the count of "Poor Quality" data of a sector is higher than a third predetermined value, $N_3 \leq C$, this indicates that the quality of the sector's data degraded to an intolerable degree. Causes of the degrading may be internal to the sector, such as an extensive wear caused by an excessive number of read and write operations, or some material or manufacturing irregularity. In either case, it is likely that the quality of data written into the sector in the future will degrade as well. This foreseeable degrading can be prevented by immediately, or with high priority, transcribing the data from this low quality sector to another sector of the memory system. The low quality sector can then be retired so that in the future no data will be written into it.

Some further embodiments utilize tracking cells positioned among the regular memory cells of the memory system. Tracking cells and their operation are described, for example, in U.S. Pat. Nos. 6,222,762 B1 and 6,275,419 B1, both granted to D. Guterman et al.

Tracking cells experience the same external and internal influences as the regular memory cells, thus the statistics of the tracking cells can be representative of the statistics of the whole array of memory cells. Therefore, a memory system can be operated according to the steps of FIG. 5 in relation to the count of "Poor Quality" data among the tracking cells only.

Figure 6:
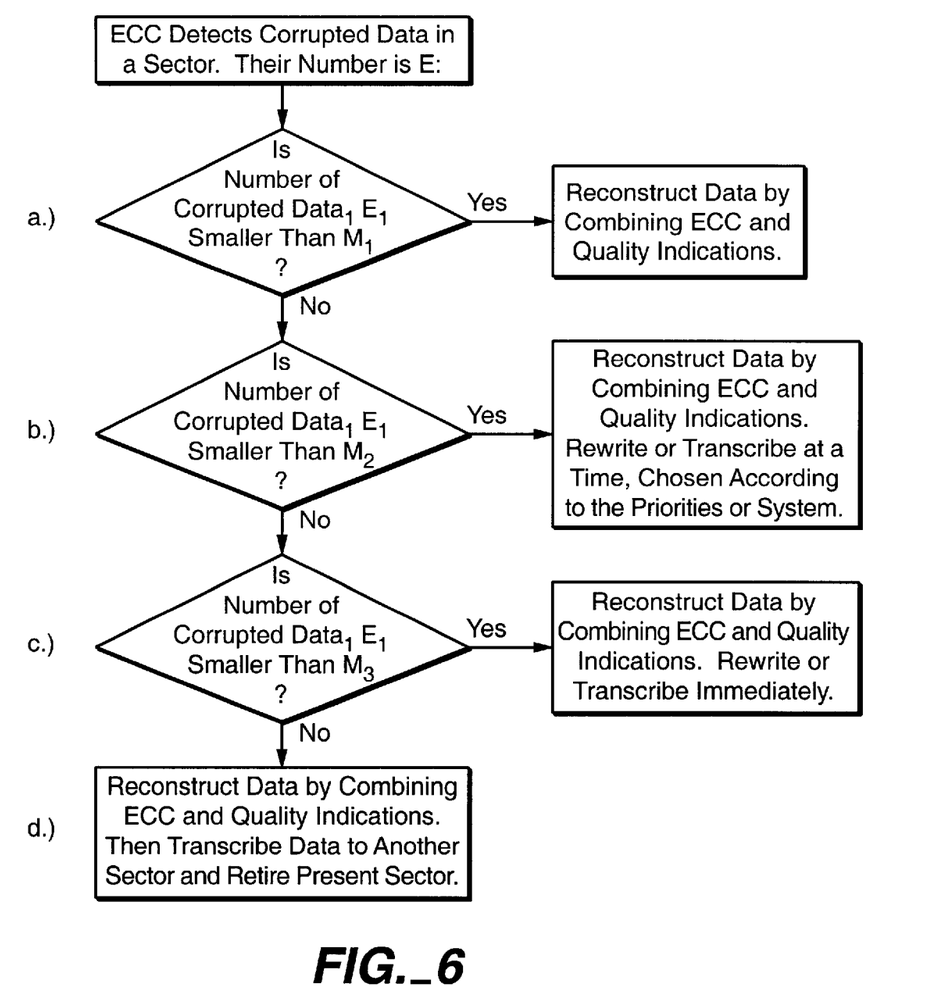
FIG. 6 illustrates a flowchart of operating the memory system based on the number of errors in a data sector.

Another embodiment compiles the number of errors, detected by the ECC, when reading the data of a sector. As illustrated by the flow chart in FIG. 6, different types of corrective actions can be executed in relation to the number of errors.

a) If E, the number of errors in a sector is zero or less than a first predetermined value $M_1$, $E<M_1$, this indicates that the data of the sector were not corrupted, or only to a low, tolerable degree, thus they can be reconstructed reliably by the ECC, possibly in combination with the quality indications.

b) If E, the number of errors in a sector is between a first and a second predetermined value, $M_1 \leq E < M_2$, this indicates that the data of the sector have been corrupted to some degree. Therefore, first the sector's data has to be reconstructed by the ECC, possibly in combination with the quality indications, and then the sector's data should be refreshed, rewritten, or transcribed to another sector at some time. However, the degree of corruption is such that the data can still be reconstructed with high reliability by the ECC, possibly in combination with the quality indications. Moreover, these corrective actions need not be executed immediately, but can be delayed until a suitable later time. For example, these corrective actions can be executed at a time, when the memory system has finished executing the read commands, and is also not performing any other higher priority jobs.

c) If E, the number of errors in a sector is between a second and a third predetermined value, $M_2 \leq E < M_3$, this indicates that the data of the sector have been corrupted to a considerable degree. Therefore, first the sector's data has to be reconstructed by the ECC, possibly in combination with the quality indications, and then the sector's data should be refreshed, rewritten, or transcribed to another new sector immediately, or within a short, predetermined delay.

d) If E, the number of errors in a sector is higher than a third predetermined value, $M_3 \leq E$, this indicates that the data of the sector have been corrupted to an intolerable degree. Causes of the corruption may be internal to the sector, such as an extensive wear caused by an excessive number of read and write operations, or some material or manufacturing irregularity. In either case, it is likely that data written into the sector in the future will get corrupted again. Therefore, first the sector's data has to be reconstructed by the ECC, possibly in combination with the quality indications. Second, future corruption of the data can be prevented by immediately, or with high priority, transcribing the data from the corrupted sector to another new sector of the memory system. Afterwards, the corrupted sector can be retired so that in the future no data will be written into it.

As mentioned earlier, Error Correction Codes cannot recover more than a number K of corrupted data with high probability. In the earlier example K took the value 5. Sometimes it is said that the ECC is "swamped," if more than K data are corrupted in a sector. In the above flow chart $M_3$ can be equal to or different from K. In particular, the memory system can be operated such that even though the ECC can reconstruct the data with high probability, i.e. E<K, the data is to be transcribed and the sector is to be retired, i.e. $M_3 < E < K$.

In some embodiments, the errors can be counted by counters of limited capacity. An example can be a four-value counter for each sector, if the ECC can reconstruct data reliably with four corrupted data per sector, i.e. K=4. If the number of errors, indicated by the ECC, exceeds 4, E>4, then the error counter may provide an "Overflow" signal. In this case the ECC may try again reconstructing the corrupted data, but now by utilizing the quality indication as well. If the results are satisfactory, they can be accepted for a subsequent transfer to a user.

Although the various aspects of the present invention have been described with respect to certain preferred embodiments, it is understood that the invention is entitled to protection within the full scope of the appended claims.

What is claimed is:

1. A method of operating a memory system comprising:
   reading individual data storage values and error correction data from the memory system;
   representing the individual read data storage values by digital data values and associated quality indications; and
   applying a combination of an error correction code and the quality indications to the digital data values representing the data storage values read from the memory system.

2. The method of claim 1, wherein the reading of the data storage values is performed in parallel from a plurality of non-volatile memory cells.

3. The method of claim 1, wherein representing the individual read data storage values includes:
   generating the digital data values according to which defined non-overlapping storage value intervals the data storage values lie within, wherein the individual storage value intervals include a central preferred range and at least one peripheral range adjacent thereto.

4. The method of claim 3, wherein representing the individual read data storage values by associated quality indications includes:
   generating the associated quality indications to indicate whether the data storage values lie within the preferred or the adjacent ranges of the storage value intervals within which they lie, whereby Good Quality data are indicated when the data storage values lie within the preferred ranges, and Poor Quality data are indicated when the data storage values lie within the adjacent ranges.

5. The method of claim 4, wherein the individual storage value intervals include one of the preferred ranges and one of the adjacent ranges on each side of the preferred range, and further wherein generating the associated quality indications includes:
   generating an indication of which of the adjacent ranges the data storage values lie within, when a Poor Quality indication was associated with the data storage values.

6. The method of claim 5, wherein generating an indication of which of the adjacent ranges the data storage values lie in includes:
   indicating High Anomaly data when the data storage values lie within the adjacent range above the central preferred range; and
   indicating Low Anomaly data when the data storage values lie within the adjacent range below the central preferred range.

7. The method of claim 6, wherein representing the individual read data storage values by digital data values and associated quality indications includes:
   representing the individual data storage values by digital data values, by a digital representation of its associated Good Quality or Poor Quality indication, and by a digital representation of its associated Low Anomaly or High Anomaly indication.

8. The method of claim 7, wherein applying an error correction code to the digital data values includes:
   reconstructing at least one corrupted digital data value by applying the error correction code when the applied error correction code is capable of reconstructing the at least one corrupted digital data value, whereby the at least one corrupted digital data value has been detected by the error correction code; and
   reconstructing at least one corrupted digital data value by applying the error correction code in combination with the associated quality indications when the applied error correction code is not capable of reconstructing the at least one corrupted digital data value, whereby the at least one corrupted digital data value has been detected by the error correction code.

9. The method of claim 8, wherein reconstructing at least one corrupted digital data value includes:
   modifying at least one digital data value using an associated Poor Quality indication.

10. The method of claim 9, wherein modifying at least one digital data value includes:
    modifying at least one digital data value according to the associated quality indication of which of the adjacent ranges the at least one data storage value lies within, whereby the at least one digital data value is increased when a High Anomaly is indicated and the at least one digital data value is decreased when a Low Anomaly is indicated.

11. The method of claim 10, wherein applying the error correction code in combination with the associated quality indications includes:
modifying at least one digital data value according to the associated quality indications; and
repeating the act of modifying at least one digital data value until the error correction code is capable of correcting the digital data values.

12. A method of operating a memory system comprising:
reading a plurality of data storage values from the memory system;
representing the read data storage values by digital data values and associated quality indications;
constructing statistics of a plurality of quality indications associated with the plurality of data storage values; and
utilizing the statistics of associated quality indications to operate the memory system.

13. The method of claim 12, wherein the reading of the data storage values is performed in parallel from a plurality of non-volatile memory cells.

14. The method of claim 12, wherein representing the read data storage values individually include:
generating the digital data values according to which defined non-overlapping storage value intervals the data storage values lie within, wherein the storage value intervals are separated by separations points; and
generating the associated quality indications according to where the read data storage values lie within the storage value intervals.

15. The method of claim 14, wherein utilizing the statistics of a plurality of associated quality indications to operate the memory system includes:
modifying the separation points according to the statistics of the plurality of associated quality indications.

16. The method of claim 15, wherein constructing a statistics of a plurality of associated quality indications includes:
establishing a number of the read data storage values lying in individual sub-intervals of storage value intervals, wherein the storage value intervals individually include a plurality of non-overlapping sub-intervals; and
identifying separation points as the plurality of sub-intervals in which the number of data storage values is smaller than a predetermined value.

17. The method of claim 16, wherein modifying the separation points according to the statistics of the plurality of associated quality indications includes:
modifying at least one separation point to lie within a corresponding separation gap.

18. A method of operating a memory system comprising:
reading a plurality of data storage values from the memory system;
representing the data storage values by digital data values and associated quality indications;
accumulating the quality indications,
classifying the accumulated quality indications; and
utilizing the classification of the accumulated quality indications to operate the memory system.

19. The method of claim 18, wherein the reading of the data storage values is performed in parallel from non-volatile memory cells.

20. The method of claim 18, wherein representing the data storage values includes:
generating the digital data values according to which defined non-overlapping storage value intervals the data storage values lie within, wherein the storage value intervals individually include a central preferred range and at least one peripheral range adjacent thereto; and
generating the associated quality indications to indicate whether the data storage values lie within the central preferred range or the at least one peripheral range of the storage value intervals in which they lie, whereby Good Quality data are indicated when the data storage values lie within the central preferred range, and Poor Quality data are indicated when the data storage values lie within the least one peripheral ranges.

21. The method of claim 20, wherein classifying the quality indications associated with a plurality of the memory cells includes:
establishing the number of Poor Quality data in at least one plurality of memory cells.

22. The method of claim 21, wherein utilizing the classification of the accumulated quality indications to operate the plurality of the memory cells includes:
managing the data storage values of the at least one plurality of memory cells according to the number of Poor Quality data of the plurality of memory cells, comprising:
leaving the data storage values unchanged when the number of Poor Quality data is less than a first predetermined value.

23. The method of claim 22, wherein utilizing the classification of the accumulated quality indications to operate the system plurality of the memory cells includes one of:
rewriting the data storage values into the same plurality of memory cells; and
transcribing the data storage values into a different plurality of memory cells, after a time chosen according to the priorities of the system, when the number of Poor Quality data is smaller than a second predetermined value, but not smaller than the first predetermined value.

24. The method of claim 23, wherein utilizing the classification of the accumulated quality indications to operate the system plurality of the memory cells includes one of:
rewriting the data storage values into the same plurality of memory cells; and
transcribing the data storage values into a different plurality of memory cells, immediately, or after a predetermined delay, when the number of Poor Quality data is smaller than a third predetermined value, but not smaller than the second predetermined value.

25. The method of claim 24, wherein utilizing the classification of the accumulated quality indications to operate the plurality of the memory cells includes:
transcribing the data storage values of the at least one plurality of memory cells into a different plurality of memory cells; and
retiring the at least one plurality of memory cells, when the number of Poor Quality data is not smaller than a third predetermined value.

26. A method of operating a memory system comprising:
reading individual data storage values from the memory system;
representing the individual read data storage values by digital data values and associated quality indications;
applying an error correction code to determine the a number of corrupted digital data values representing the data storage values of a plurality of memory cells;
reconstructing the corrupted digital data values by applying the error correction code and the quality indications in combination; and
utilizing the number of corrupted digital data values to operate the memory system.

27. The method of claim 26, wherein representing the individual read data storage values includes:
generating the digital data values according to which defined non-overlapping intervals of storage values the data storage values lie, wherein the individual storage value intervals include a central preferred range and at least one peripheral range adjacent thereto; and
generating the associated quality indications to indicate whether the data storage values lie within the central preferred range or the at least one peripheral range of the individual storage value intervals in which they lie, whereby Good Quality data are indicated when the data storage values lie within the central preferred range, and Poor Quality data are indicated when the data storage values lie within the at least one peripheral range.

28. The method of claim 27, wherein the intervals of storage values include the central preferred range and one of the at least one peripheral range, and further wherein generating the associated quality indications includes:
generating an indication of which of the peripheral ranges the data storage values lie in, when a Poor Quality indication was associated with the data storage values.

29. The method of claim 28, wherein generating an indication of the at least one peripheral range the data storage values lie includes:
indicating High Anomaly data when the data storage values lie within the at least one peripheral range above the central preferred range; and
indicating Low Anomaly data when the data storage values lie within the at least one peripheral range below the central preferred range.

30. The method of claim 29, wherein representing the read data storage values by digital data values and associated quality indications includes:
representing the read data storage values individually by the associated digital data values, by a digital representation of its associated Good Quality or Poor Quality indication, and by a digital representation of its associated Low Anomaly or High Anomaly indication.

31. The method of claim 30, additionally comprising utilizing the number of corrupted digital data values to operate the memory system by:
managing the data storage values of the plurality of memory cells according to the number of corrupted digital data values of the plurality of memory cells, comprising reconstructing the data storage values by the error correction code in combination with the quality indications, when the number of corrupted digital data values is less than a first predetermined value.

32. The method of claim 31, wherein utilizing the number of corrupted digital data values to operate the memory system additionally includes:
reconstructing the data storage values by the error correction code in combination with the quality indications; and one of
rewriting the data storage values into the same plurality of memory cells; or
transcribing the data storage values into a different plurality of memory cells, after a time chosen according to the priorities of the system when the number of corrupted digital data values is smaller than a second predetermined value, but not smaller than the first predetermined value.

33. The method of claim 31, wherein utilizing the number of corrupted digital data values to operate the memory system additionally includes:
reconstructing the data storage values by the error correction code in combination with the quality indications; and one of
rewriting the data storage values into the same plurality of memory cells; and
transcribing the data storage values into a different plurality of memory cells, immediately, or after a predetermined delay, when the number of corrupted digital data values is smaller than a third predetermined value, but not smaller than the second predetermined value.

34. The method of claim 31, wherein utilizing the number of corrupted digital data values to operate the memory system additionally includes:
reconstructing the data storage values by the error correction code in combination with the quality indications;
transcribing the data storage values into a different plurality of memory cells; and
retiring the plurality of memory cells when the number of corrupted digital data values is not smaller than a third predetermined value.

35. A method of operating a memory system of a type that stores digital data as analog values and stores error correction codes calculated from blocks of stored digital data, comprising:
utilizing non-overlapping ranges of the analog values to represent specified values of the digital data, the defined ranges being separated from one another by analog value intervals,
reading the analog values and converting the analog values to the digital data represented thereby,
providing indications of the quality of the digital data from a relationship of the read analog values from which the digital data was converted and the defined ranges, and
utilizing both the quality indications and the stored error correction codes to together correct for digital data represented by analog values read outside of the defined ranges.

36. The method of claim 35, wherein providing indications of the quality of the digital data from the relationship of their read analog values and the defined ranges includes identifying both a relative magnitude and direction of the read analog values with respect to the defined ranges.

37. A method of operating a memory system of a type that stores digital data as analog values, comprising:
utilizing non-overlapping ranges of the analog values that individually represent the states of one or more bits of digital data, the defined ranges being separated from one another by analog value intervals, reading the analog values and converting the analog values to the one or more bits of digital data represented thereby, and adding two additional bits to the converted one or more bits of digital data that provide an indication of the quality of the converted one or more bits of digital data, one of the additional bits indicating a magnitude and the other of the additional bits whether that magnitude is positive or negative relative to the defined ranges of the read analog values from which the digital data was converted.

38. The method of claim 37, additionally comprising utilizing both the two additional bits and error correction codes calculated from blocks of digital data to together correct for digital data represented by analog values read outside of the defined ranges.

* * * * *